(12) United States Patent
Bolis et al.

(10) Patent No.: US 12,222,491 B2
(45) Date of Patent: Feb. 11, 2025

(54) ELECTROSTATIC ACTUATION FOR DIFFRACTIVE OPTICAL DEVICES

(71) Applicant: APPLE INC., Cupertino, CA (US)

(72) Inventors: Sebastien Bolis, Crolles (FR); Arnaud Pouydebasque, Varces-Allieres-et-Risset (FR)

(73) Assignee: APPLE INC., Cupertino, CA (US)

( * ) Notice: Subject to any disclaimer, the term of this patent is extended or adjusted under 35 U.S.C. 154(b) by 573 days.

(21) Appl. No.: 17/581,928

(22) Filed: Jan. 23, 2022

(65) Prior Publication Data

US 2022/0382042 A1 Dec. 1, 2022

Related U.S. Application Data

(60) Provisional application No. 63/193,605, filed on May 27, 2021.

(51) Int. Cl.
G02B 26/08 (2006.01)
G02B 5/18 (2006.01)
G03F 7/00 (2006.01)

(52) U.S. Cl.
CPC ....... *G02B 26/0808* (2013.01); *G02B 5/1857* (2013.01); *G03F 7/0005* (2013.01)

(58) Field of Classification Search
CPC .. G02B 26/0808; G02B 5/1857; G03F 7/0005
USPC ........................................................ 359/221
See application file for complete search history.

(56) References Cited

U.S. PATENT DOCUMENTS

| 3,758,199 A | 9/1973 | Thaxter |
| 4,332,473 A | 6/1982 | Ono |
| 6,834,142 B2 | 12/2004 | Bailey et al. |
| 7,920,330 B2 | 4/2011 | Aschwanden et al. |

(Continued)

FOREIGN PATENT DOCUMENTS

| CN | 108845416 A | 11/2018 |
| WO | 19999048197 A3 | 9/1999 |

(Continued)

OTHER PUBLICATIONS

Rodrigues et al., "Strong piezoelectricity in single-layer graphene deposited in SiO2 grating substrates," Nature Communications, pp. 1-6, Jun. 25, 2015.

(Continued)

*Primary Examiner* — Wyatt A Stoffa
*Assistant Examiner* — Grant A Gagnon
(74) *Attorney, Agent, or Firm* — Meitar Patents Ltd.; Daniel Kligler

(57) ABSTRACT

An optical device includes first and second planar substrates having respective first and second faces and including first and second diffractive structure disposed respectively on the first and second faces. First and second planar electrodes are disposed respectively on the first and second faces. A mount holds the second planar substrate parallel to the first planar substrate, with the second face adjacent to the first face and with the first and second planar electrodes in mutual proximity, while permitting the second planar substrate to move transversely relative to the first planar substrate. A control circuit is coupled to apply an electrical potential between the first and second planar electrodes with a voltage sufficient to shift the second diffractive structure transversely relative to the first diffractive structure.

20 Claims, 8 Drawing Sheets

(56) References Cited

U.S. PATENT DOCUMENTS

| | | |
|---|---|---|
| 8,674,689 B1 | 3/2014 | Nielson et al. |
| 9,733,402 B2 | 8/2017 | Liu et al. |
| 9,976,952 B2 | 5/2018 | Sriram et al. |
| 10,018,831 B2 | 7/2018 | Corbelli et al. |
| 2003/0215183 A1 | 11/2003 | Wildnauer et al. |
| 2004/0212869 A1 | 10/2004 | Srinivasan et al. |
| 2009/0238217 A1 | 9/2009 | Moser et al. |
| 2020/0379250 A1 | 12/2020 | Takashima et al. |
| 2021/0302659 A1 | 9/2021 | Lee et al. |

FOREIGN PATENT DOCUMENTS

| | | |
|---|---|---|
| WO | 2007082952 A1 | 7/2007 |
| WO | 2020208380 A1 | 10/2020 |

OTHER PUBLICATIONS

U.S. Appl. No. 17/228,740 Office Action dated Feb. 7, 2024.
U.S. Appl. No. 17/228,740 Office Action dated Nov. 3, 2023.
Yu et al., "Tunable Optical Gratings Based o Buckled Nanoscale Thin Films on Transparent Elastomeric Substrates", Applied Physics Letters, vol. 96, pp. 1-3, year 2010.
Wong et al., "Analog Tunable Gratings Driven by Thin-Film Piezoelectric Microelectromechanical Actuators", Applied Optics, vol. 42, No. 4, pp. 621-626, Feb. 1, 2003.
Spremo et al., "Piezoelectric Diffraction-Based Optical Switches", NASA Tech Briefs, pp. 13-14, Nov. 2003.
Ji et al., "Soft Tunable Diffractive Optics with Multifunctional Transparent Electrodes Enabling Integrated Actuation", Applied Physics Letters, No. 3, vol. 109, pp. 1-7, year 2016.
Kowarz et al., "Conformal Grating ElectroMechanical System (GEMS) for High-Speed Digital Licht Modulation", Technical Digest of IEEE 15th International Conference on MEMS, pp. 568-573, year 2002.
Zhang et al., "MEMS Grating with Interdigitated-Comb Structure", Key Engineering Materials, vol. 503, pp. 49-54, year 2012.
Bernet et al., "Multi-Color Operation of Tunable Diffractive Lenses", Optics Express, vol. 25, issue 3, pp. 2469-2480, year 2017.
Kress, "Free-Space Micro-Optics," in "Field Guide to Digital Micro-Optics," SPIE Field Guides, vol. FG33, p. 11, year 2014.
O'Shea et al., "Diffractive Optics: Design, Fabrication and Test", SPIE Tutorial Texts in Optical Engineering, vol. TT62, pp. 66-72, SPIE Press, USA 2004.
Bolis et al., U.S. Appl. No. 17/228,740, filed Apr. 13, 2021.
Bolis et al., U.S. Appl. No. 17/581,926, filed Jan. 23, 2022.

ELECTROSTATIC ACTUATION FOR DIFFRACTIVE OPTICAL DEVICES

CROSS-REFERENCE TO RELATED APPLICATION

This application claims the benefit of U.S. Provisional Patent Application 63/193,605, filed May 27, 2021, which is incorporated herein by reference.

FIELD OF THE INVENTION

The present invention relates generally to optical devices, and particularly to tunable diffractive optical elements and methods for their fabrication and operation.

BACKGROUND

Diffractive optical elements (DOEs) are optical components with micro-structure patterns that modulate the phase of incident beams of optical radiation. Such elements can be designed to operate in a reflective mode or in a transmissive mode. DOEs possess unique optical properties, which often cannot be attained with optical elements operating on refractive or reflective principles. The optical effect of the DOE depends on the spacing and depth of the diffractive microstructure pattern. In the context of the present description and in the claims, the terms "diffractive optical element" and "DOE" refer both to conventional DOEs and to metasurfaces.

The term "diffractive structure" is used in the present description and in the claims to refer to repeating microstructure patterns that are formed on or within a substrate, with shapes and dimensions chosen to modulate the local phase of the incident light that the DOE is designed to diffract. The patterns may repeat in one dimension, as in classical diffraction gratings, or in two dimensions, as in metasurfaces. The dimensions of the diffractive structures may range from a small fraction of the target wavelength (as in metasurfaces) to about 100 wavelengths, depending on the intended use.

The terms "light" and "optical radiation" are used in the present description and in the claims to refer to electromagnetic radiation in any of the visible, infrared, and ultraviolet spectral ranges.

SUMMARY

Embodiments of the present invention that are described hereinbelow provide tunable diffractive optical elements and methods for their fabrication and operation.

There is therefore provided, in accordance with an embodiment of the invention, an optical device, including a first planar substrate having a first face and including a first diffractive structure disposed on the first face, and a second planar substrate having a second face and including a second diffractive structure disposed on the second face. A first planar electrode is disposed on the first face, and a second planar electrode is disposed on the second face. A mount holds the second planar substrate parallel to the first planar substrate, with the second face adjacent to the first face and with the first and second planar electrodes in mutual proximity, while permitting the second planar substrate to move transversely relative to the first planar substrate. A control circuit is coupled to apply an electrical potential between the first and second planar electrodes with a voltage sufficient to shift the second diffractive structure transversely relative to the first diffractive structure.

In a disclosed embodiment, the mount includes a set of flexible beams, including silicon for example, connecting the second planar substrate to a frame to which the first planar substrate is fixed.

Additionally or alternatively, the device includes third and fourth planar electrodes disposed in mutual proximity on the first and second faces, respectively, wherein the control circuit is configured to apply a first electrical potential between the first and second planar electrodes in order to shift the second diffractive structure relative to the first diffractive structure in a first transverse direction and to apply a second electrical potential between the third and fourth planar electrodes in order to shift the second diffractive structure relative to the first diffractive structure in a second transverse direction, different from the first transverse direction.

In some embodiments, the first and second planar electrodes are interleaved respectively in the first and second diffractive structures. In one embodiment, the first and second planar electrodes are disposed in respective serpentine patterns within the first and second diffractive structures.

In a disclosed embodiment, the second planar substrate has a third face opposite the second face, and the device includes a planar cover, which has a fourth face and is mounted with the fourth face parallel to and in proximity to the third face, and third and fourth planar electrodes disposed in mutual proximity on the third and fourth faces, respectively. The control circuit is configured to apply simultaneously a first electrical potential between the first and second planar electrodes and a second electrical potential between the third and fourth planar electrodes in order to shift the second diffractive structure relative to the first diffractive structure.

In another embodiment, the device includes an actuator, which is controllable by the control circuit to apply a first transverse shift to the second diffractive structure relative to the first diffractive structure, wherein application of the electrical potential between the first and second planar electrodes applies a second transverse shift to the second diffractive structure in addition to the first transverse shift.

Additionally or alternatively, the device includes a spacer, which is disposed between the first and second faces and is configured to maintain a predefined distance between the first and second faces while permitting the second planar substrate to move transversely relative to the first planar substrate. In one embodiment, the spacer includes a liquid enclosed between the first and second faces. In another embodiment, the spacer includes one or more spherical particles, which roll between the first and second faces as the second planar substrate moves transversely relative to the first planar substrate.

There is also provided, in accordance with an embodiment of the invention, an optical system, including a device as described above and a radiation source, which is configured to direct a beam of optical radiation toward the device, wherein shifting the second diffractive structure transversely relative to the first diffractive structure modifies an optical property of the beam.

In one embodiment, the first and second planar substrates are transparent to the optical radiation, and the device is configured to modify the optical property as the beam is transmitted through the device.

In another embodiment, the device is configured to modify the optical property as the beam is reflected from the device.

There is additionally provided, in accordance with an embodiment of the invention, a method for controlling a beam of optical radiation. The method includes directing the beam of optical radiation toward a device including a first planar substrate having a first face and including a first diffractive structure disposed on the first face, a second planar substrate having a second face and including a second diffractive structure disposed on the second face, a first planar electrode disposed on the first face, a second planar electrode disposed on the second face, and a mount holding the second planar substrate parallel to the first planar substrate, with the second face adjacent to the first face and with the first and second planar electrodes in mutual proximity, while permitting the second planar substrate to move transversely relative to the first planar substrate. An electrical potential is applied between the first and second planar electrodes with a voltage sufficient to shift the second diffractive structure transversely relative to the first diffractive structure, thereby modifying an optical property of the beam.

There is further provided, in accordance with an embodiment of the invention, a method for fabricating an optical device. The method includes forming a first diffractive structure on a first face of a first planar substrate and forming a second diffractive structure on a second face of a second planar substrate. A first planar electrode is deposited on the first face, and a second planar electrode is deposited on the second face. The second planar substrate is mounted parallel to the first planar substrate, with the second face adjacent to the first face and with the first and second planar electrodes in mutual proximity, while permitting the second planar substrate to move transversely relative to the first planar substrate. A control circuit is coupled to apply an electrical potential so as to shift the second diffractive structure transversely relative to the first diffractive structure.

In the disclosed embodiments, forming the first diffractive structure and the second diffractive structure includes applying at least one of an etching process and a nano-imprint process to the first face and the second face to create diffractive elements.

In one embodiment, depositing the first planar electrode and the second planar electrode includes interleaving at least one of the first and second planar electrodes with at least one of the first and second diffractive structures.

In another embodiment, depositing the first planar electrode and the second planar electrode includes depositing at least one of the first and second planar electrodes on at least one of the first face and the second face before forming the diffractive structure on the at least one of the first face and the second face.

The present invention will be more fully understood from the following detailed description of the embodiments thereof, taken together with the drawings in which:

DETAILED DESCRIPTION OF EMBODIMENTS

Overview

The efficiency and versatility of operation of a diffractive optical device can be enhanced by positioning two DOEs in mutual proximity, so that the diffractive structures on the two DOEs operate cooperatively on incident light. This sort of device can be used in controlling the optical properties of a beam that is transmitted through or reflected from the device, for example by deflecting, focusing, or diffusing the beam. Small transverse shifts of one of the DOEs relative to the other can be used to modify these optical properties in a controlled manner, such as in changing the deflection angle.

Embodiments of the present invention that are described herein provide novel optical devices of this sort, which enable precise control over the optical properties of a transmitted or reflected beam while maintaining a low profile and compact form factor. In the disclosed embodiments, an optical device comprises a pair of planar substrates, which comprise diffractive structures on respective faces of the substrates. A respective planar electrode is also formed on the face of each of the substrates. A mount holds the planar substrates parallel to one another, with the faces on which the diffractive structures are formed adjacent to one another and the respective electrodes in mutual proximity, while permitting one of the substrates to move transversely relative to the other. (The term "transverse" refers to motion in the plane of the substrate.)

To shift one of the substrates relative to the other, a control circuit applies an electrical potential between the electrodes, which gives rise to an electrostatic attraction between the electrodes. The potential applied between the electrodes is set to a voltage sufficient to cause a relative transverse shift between the diffractive structures on the two substrates, and thus to modify an optical property of a beam of light that is incident on the device.

The use of mutually parallel electrodes on the planar substrates themselves makes the device easy to produce, using thin-film technologies that are known in the art; and the actuation mechanism based on parallel electrodes can fit compactly within the areas of the planar substrates, with little or no addition to the overall dimensions of the device. Because they rely on electrostatic actuation, devices in accordance with embodiments of the invention typically have fast response and low power consumption. They can also achieve high accuracy in controlling the relative displacement between the substrates, and thus in modulating the optical properties of the device. These properties make devices in accordance with embodiments of the invention suitable for swept, dynamic actuation (in addition to switching between static positions of the substrates), in both open- and closed-loop configurations.

Device Design

Figure 1A:
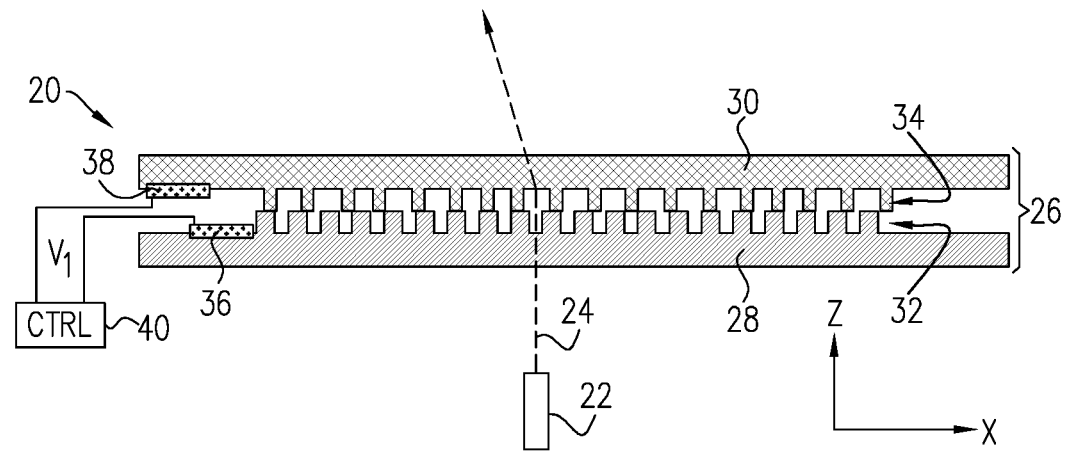
FIGS. 1A and 1B are schematic side views of an optical system in two different states of actuation, in accordance with an embodiment of the invention.
Figure 1B:
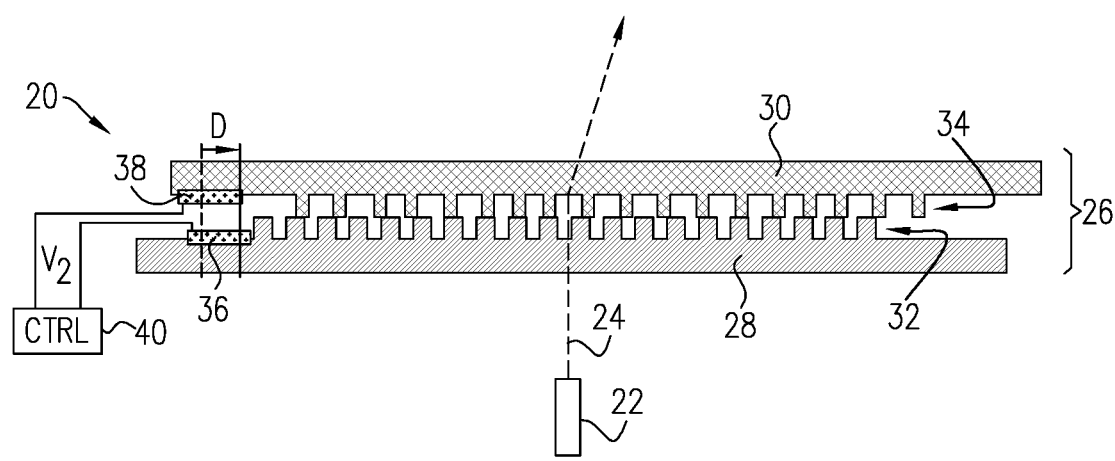
Figure 2A:
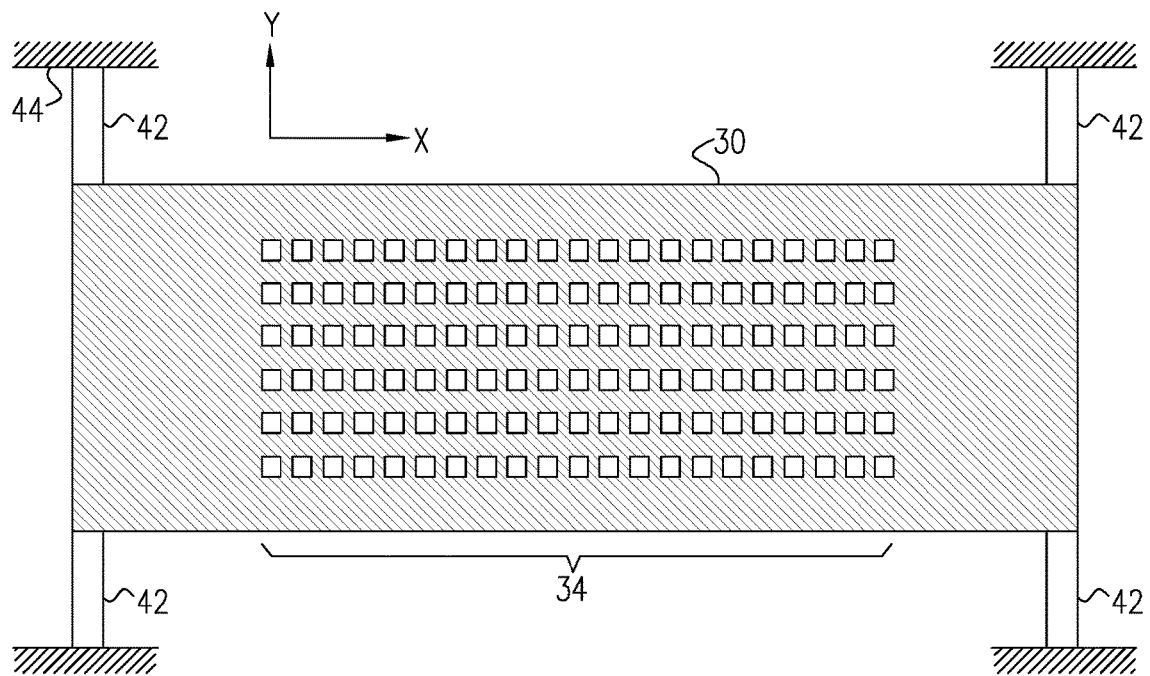
FIGS. 2A and 2B are schematic top views of an optical beam modulation device in two different states of actuation, in accordance with an embodiment of the invention.
Figure 2B:
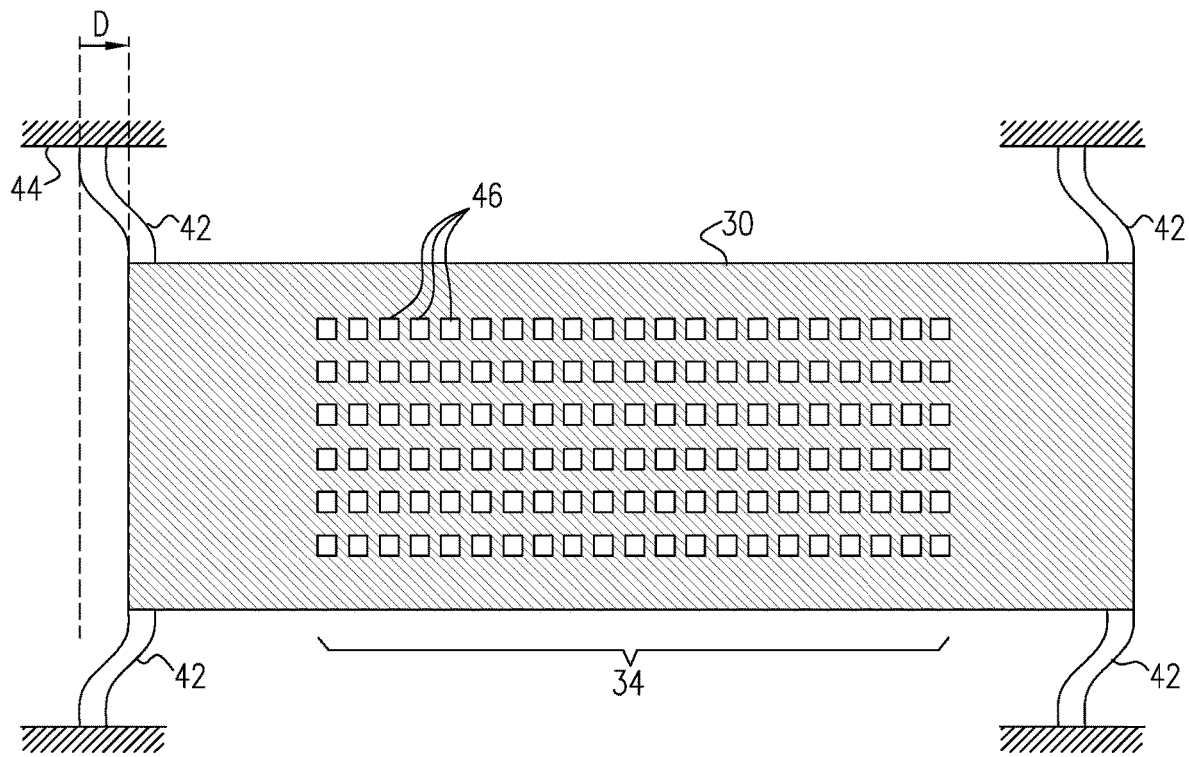

Reference is now made to FIGS. 1A/B and FIGS. 2A/B, which schematically illustrate an optical system 20, in accordance with an embodiment of the invention. FIGS. 1A and 1B are schematic side views of system 20, including an optical beam modulation device 26 in two different states of actuation. FIGS. 2A and 2B are schematic top views of device 26 in the two different states of actuation.

As shown in FIGS. 1A/B, system 20 comprises a radiation source, such as a laser 22, which directs a beam 24 of optical radiation toward beam modulation device 26. Device 26 comprises a pair of planar substrates 28 and 30, which are transparent at the wavelength of beam 24, and device 26 thus deflects beam 24 as it is transmitted through the device. Alternatively or additionally, device 26 may be designed to modify other optical properties of beam 24, for example by focusing, defocusing, diffusing, and/or splitting beam 24. Although device 26, as well as other beam modulation devices that are shown and described hereinbelow, operates in a transmission mode, alternative embodiments (not shown in the figures) provide beam modulation devices that operate in reflection mode and thus modify optical properties of reflected beams.

Planar substrate 28 comprises a diffractive structure 32 on its upper face, while planar substrate 30 comprises a diffractive structure 34 on its lower face, which is parallel and adjacent to the upper face of substrate 28. (The terms "upper" and "lower" are used solely for the sake of convenience, in reference to the device orientation that is shown in the figures, and device 26 may alternatively operate in substantially any desired orientation.) Substrates 28 and 30 are taken to be oriented in the X-Y plane, and the term "transverse" is used to describe orientation or motion in this plane. In the present example, as shown in FIGS. 2A/B, diffractive structure 34 comprises a two-dimensional array of pillars 46 having sub-wavelength dimensions, for example dimensions of 500 nm or less, but alternatively device 26 may comprises other sorts of diffractive structures, which may be one- or two-dimensional and have larger or smaller dimensions, as are known in the art. Planar electrodes 36 and 38 are also deposited respectively on the upper and lower faces of substrates 28 and 30.

As shown in FIGS. 2A/B, a mount comprising a set of flexible beams 42 connects planar substrate 30 to a frame to which substrate 28 is fixed. In an example embodiment, beams 42 comprise silicon, which is etched to define the beams using methods for producing microelectromechanical systems (MEMS) that are known in the art. Alternatively, beams 42 may comprise dielectric or metal materials. Beams 42 hold substrate 30 parallel to substrate 28, with the lower face of substrate 30 adjacent to the upper face of substrate 28, and with electrodes 36 and 38 in mutual proximity, as shown in FIG. 1A. To achieve the desired electrostatic actuation, electrodes 36 and 38 are offset in the transverse direction, with a certain amount of overlap in the transverse plane.

Beams 42 are able to bend so as to permit substrate 30 to move transversely (in the X-direction) relative to substrate 28, as shown in FIGS. 1B and 2B. It is desirable that beams 42 bend flexibly in the X-direction but are relatively stiff in the Z-direction so as to aid in maintaining a constant distance between substrates 28 and 30 along the Z-axis. In an alternative embodiment (not shown in the figures), the mount enables substrate 30 to move in both the X- and Y-directions relative to substrate 28, with an electrode configuration that enables the displacement in both directions to be controlled.

A control circuit 40 controls the relative transverse shift between substrates 28 and 30 by applying an electrical potential between electrodes 36 and 38. The potential gives rise to an electrostatic attraction between the electrodes, which causes substrate 30 to shift transversely in the X-direction by a displacement that increases with increasing voltage over a certain voltage range. In the pictured embodiment, control circuit 40 applies a voltage $V_1$ (possibly zero volts) between electrodes 36 and 38 in FIG. 1A, and increases the voltage to $V_2$ in FIG. 1B. The increased voltage is sufficient to shift diffractive structure 34 transversely relative to diffractive structure 32 by a distance D, and thus change the deflection angle of beam 24. For this purpose, control circuit 40 may simply comprise a voltage source and a switch. Alternatively, more complex control circuits may be used, with tunable analog and/or digital components to allow fine control over the applied voltage and transverse shift. For example, control circuit 40 may sense the capacitance between electrodes 36 and 38 in order to measure and control the relative transverse displacement between substrates 28 and 30.

The distance D by which substrate 30 shifts for a given voltage will depend on the configuration of electrodes 36 and 38, including the electrode areas and the distance between them, as well as depending on the mechanical resistance of the mount holding substrate 30. Alternative electrode configurations, as well as other means for facilitating and controlling the motion of substrate 30, are shown in the figures that follow.

Alternative Embodiments

Figure 3:
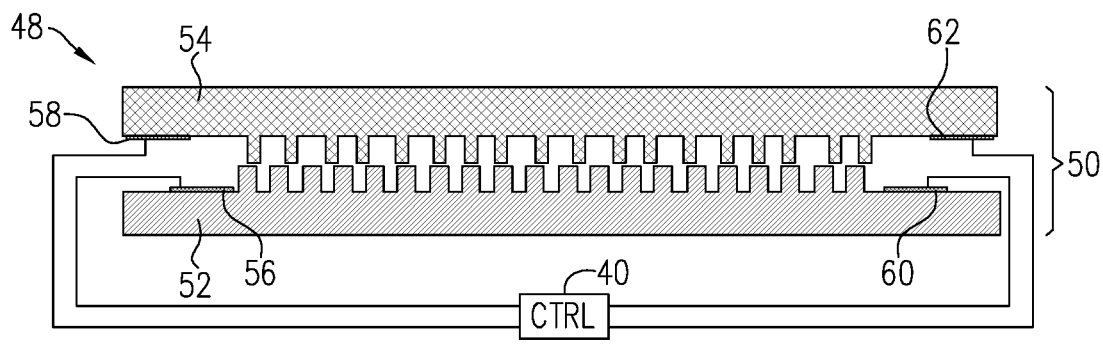
FIGS. 3, 4, 5 and 6 are schematic side views of optical systems comprising beam modulation devices, in accordance with other embodiments of the invention.

FIG. 3 is a schematic side view of an optical system comprising an optical beam modulation device 50, in accordance with another embodiment of the invention. As in the preceding embodiment, device 50 comprises planar substrates 52 and 54, with respective diffractive structures disposed on their adjoining faces. Electrodes 56 and 58 are disposed in mutual proximity on the adjoining faces of substrates 52 and 54 with a certain offset between electrodes 56 and 58 in the transverse (X) direction. In addition, another pair of electrodes 60 and 62 are disposed in mutual proximity on the adjoining faces of substrates 52 and 54, but with a different transverse offset from that between electrodes 56 and 58. In the pictured embodiment, this latter offset is also along the X-direction, but in the opposite direction. Alternatively, the offset between electrodes 60 and 62 may be in a different direction, for example along the Y-direction, assuming the mount holding substrate 54 (not shown) is capable of shifting the substrate in this direction.

The arrangement of system 48 enables control circuit 40 to control not only the extent of the transverse shift between substrates 52 and 54 and their respective diffractive structures, but also the direction: When control circuit 40 applies an electrical potential between electrodes 56 and 58, substrate 54 will shift to the right relative to substrate 52. When control circuit 40 applies an electrical potential between electrodes 60 and 62, substrate 54 will shift to the left relative to substrate 52. Although only two pairs of electrodes are shown in FIG. 3, in alternative embodiments additional electrode pairs may be provided to enable greater flexibility in controlling the direction and/or amplitude of motion.

Figure 4:
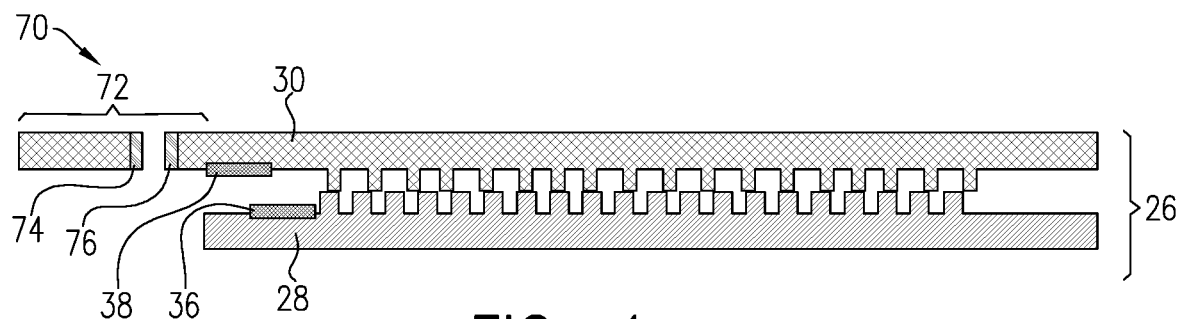

FIG. 4 is a schematic side view of an optical system 70, in accordance with a further embodiment of the invention. In this embodiment, system 70 comprises both optical beam modulation device 26, as described above, and an additional actuator 72. Control circuit 40 drives actuator 72 to apply an additional transverse shift to substrate 30 and thus to shift the diffractive structure on substrate 30 relative to that on substrate 28. Control circuit can apply actuator 72 in conjunction with the electrical potential applied between planar electrodes 36 and 38 in order to increase the range and/or the precision of the transverse shift between substrates 30 and 28.

In the pictured embodiment, actuator 72 is an electrostatic actuator, comprising a pair of electrodes 74 and 76, which are fixed respectively to the frame holding substrate 28 and to the edge of substrate 30. Application of a voltage between electrodes 74 and 76 causes an electrostatic attraction, which will cause substrate 30 to shift toward the left. Alternatively or additionally, a similar actuator may be configured to shift substrate 30 to the right. Further alternatively, other sorts of actuators may be used in place of actuator 72, such as a piezoelectric, electromagnetic, or thermal actuator.

Figure 5:
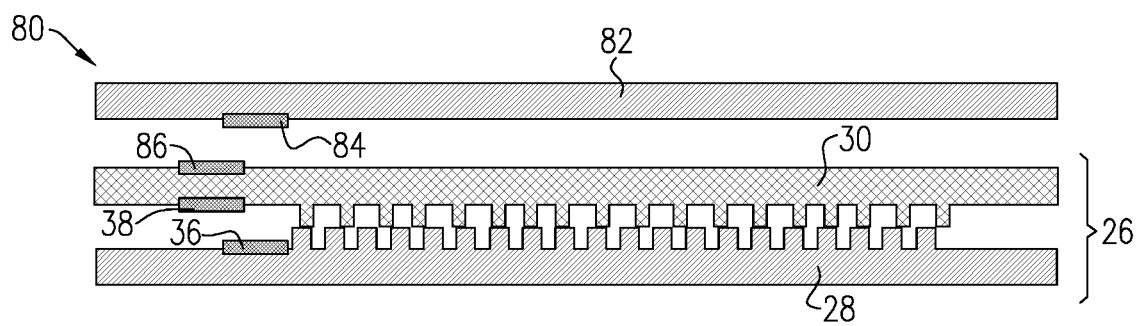

FIG. 5 is a schematic side view of an optical system 80, in accordance with yet another embodiment of the invention. In this embodiment, a planar cover 82 overlies optical beam modulation device 26 on the side of substrate 30 that is opposite substrate 28. Cover 82 is mounted with its inner face in proximity to the outer face of substrate 30 in device 26. For example, cover 82 may comprise a transparent slide, which is mounted on the frame that holds substrate 28 in order to enclose and protect moving substrate 30 and its mount.

In addition to these protective functions, a planar electrode 84 is deposited on the inner face of cover 82, and a planar electrode 86 is deposited on the outer face of substrate 30, in proximity to electrode 84. Control circuit 40 simultaneously applies an electrical potential between electrodes 36 and 38 and another (possibly equal) electrical potential between electrodes 84 and 86. The electrostatic attractions that develop as a result of these potentials between the two pairs of electrodes will cause substrate 30 to shift transversely relative to substrate 28 and to cover 82 with increased force relative to the force attainable with a single electrode pair. Furthermore, although the attractive forces between the two pairs of electrodes will have components in the same direction in the transverse (X) direction, they will have opposite force components in the normal (Z) direction. The normal forces will thus offset one another, thereby reducing or eliminating displacement between substrates 28 and 30 in the normal direction notwithstanding the attractive forces between the electrodes. This resistance to normal displacement is useful in maintaining high optical quality and predictable performance of device 26.

Figure 6:
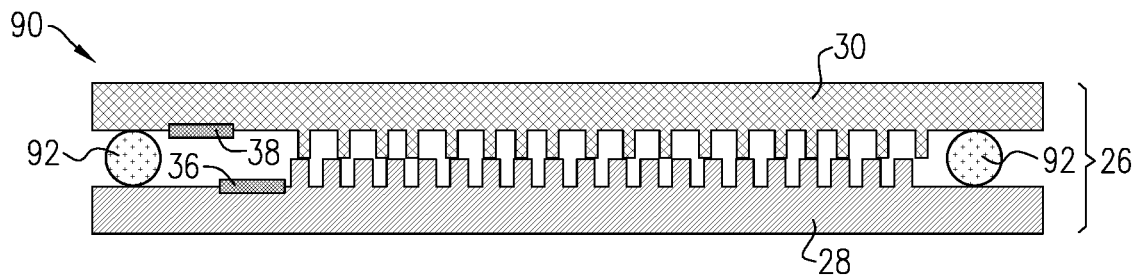

FIG. 6 is a schematic side view of an optical system 90, in accordance with an alternative embodiment of the invention. In this case, a spacer is disposed between the inner faces of substrates 28 and 30 in device 26 in order to maintain a predefined distance between the faces, notwithstanding the attractive force between electrodes 36 and 38, while still permitting substrate 30 to move transversely relative to substrate 28. In the pictured example, the spacer comprises one or more spherical particles 92, which roll between the faces of the substrates as substrate 30 moves transversely.

Alternatively or additionally, a suitable incompressible liquid, enclosed between the faces or substrates 28 and 30, may serve as the spacer. For example, an oil, such as polypropylene carbonate oil, or another dielectric liquid within the gap will be helpful in maintaining a constant distance between the substrates (resisting both electrostatic force and mechanical shocks) and may also serve as a lubricant. A liquid within the gap between substrates 28 and 30 can also be useful in enhancing the optical properties of device 26. Additionally or alternatively, if a liquid with high electrical permittivity is used, it can increase the strength of the electrostatic attraction between electrodes 36 and 38.

Figure 7A:
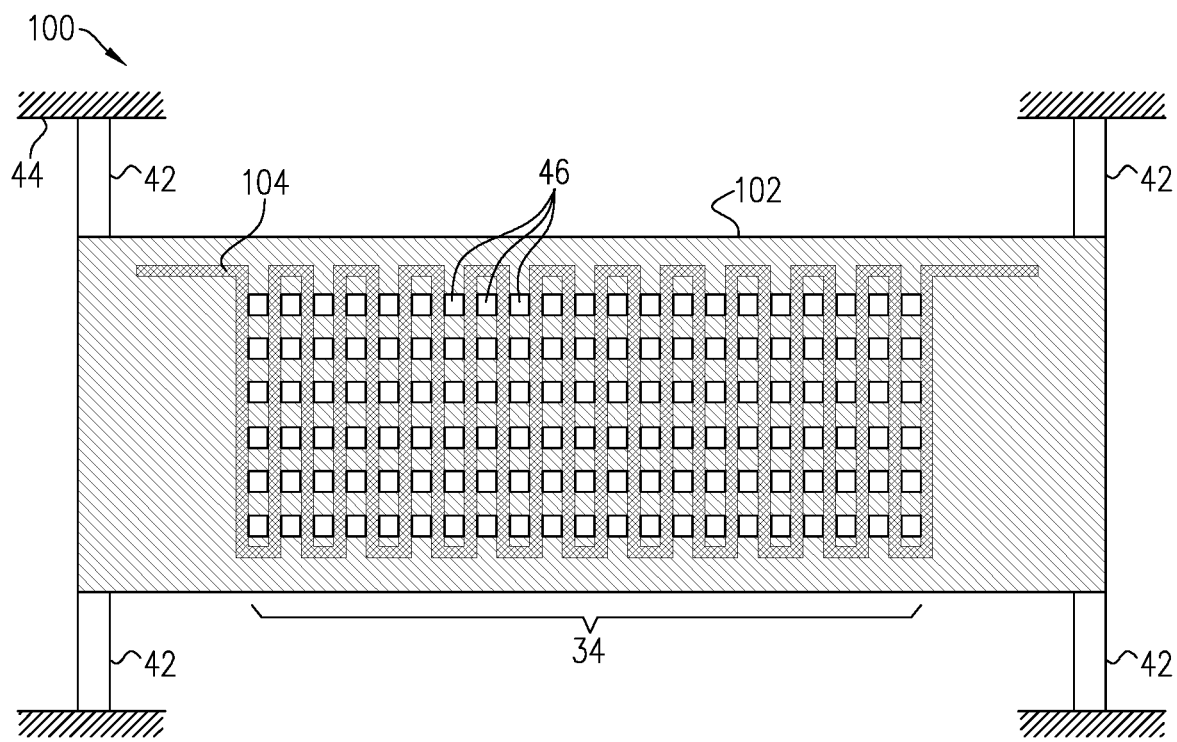
FIGS. 7A and 7B are schematic top and side views, respectively, of an optical system, in accordance with a further embodiment of the invention.
Figure 7B:
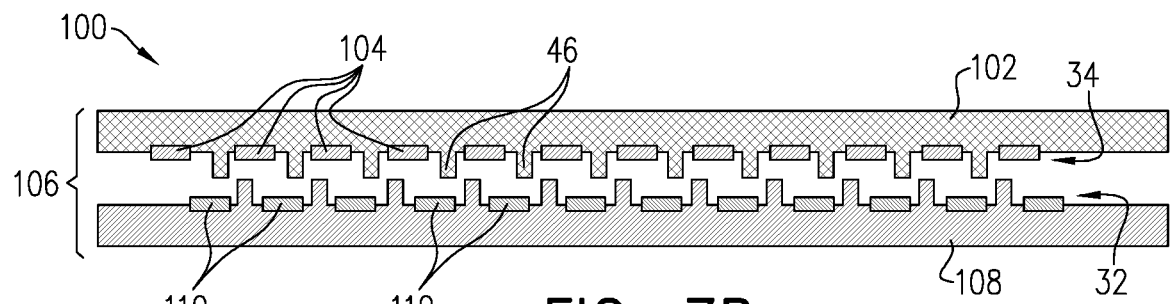

FIGS. 7A and 7B are schematic top and side views, respectively, of an optical system 100, including an optical beam modulation device 106, in accordance with a further embodiment of the invention. As in device 26, device 106 comprises parallel substrates 102 and 108, with respective diffractive structures 34 and 32 on the adjacent faces of the substrate. Flexible beams 42 connect substrate 102 to frame 44. The diffractive structures in this example, as in device 26, comprise arrays of pillars 46. In the present embodiment, however, planar electrodes 104 and 110 on the inner faces of substrates 102 and 108, respectively, are interleaved in diffractive structures 34 and 32. Specifically, in the pictured example, electrodes 104 and 110 are deposited in serpentine patterns within the respective diffractive structures.

This interleaved arrangement of electrodes 104 and 110 is advantageous in increasing the lengths of the electrodes, and thus increasing the electrostatic attraction, without increasing the sizes of substrates 102 and 108. To minimize the effect of the electrodes on the optical performance of device 106, the electrodes may comprise a transparent conductive material, such as indium tin oxide (ITO), with a suitable index matching layer overlying the electrodes, as is known in the art.

Alternatively, other electrode configurations may be used, either within or alongside the areas of the diffractive structures on the substrates. For example, the electrodes may be configured as combs with interdigitated conductive stripes. The electrodes can be interleaved with the diffractive structures, as shown in FIGS. 7A/B, or they may extend along the substrates beneath the diffractive structures.

Methods of Fabrication

Figure 8A:
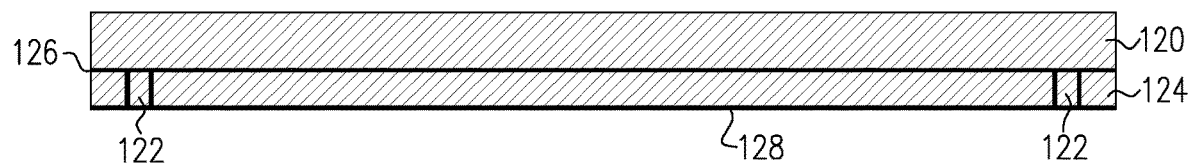
FIGS. 8A, 8B, 8C, 8D, 8E, 8F, 8G, 8H and 8I are schematic sectional views showing successive stages in a method for fabrication of an optical beam modulation device, in accordance with an embodiment of the invention.

FIGS. 8A-8I are schematic sectional views showing successive stages in a method for fabrication of an optical beam modulation device 150, in accordance with an embodiment of the invention. The process begins with a silicon-on-insulator (SOI) substrate 120, which is shown in FIG. 8A. Beams 122 are etched through a silicon device layer 124 on substrate 120 down to an intervening oxide ($SiO_2$) layer 126. An oxide layer 128 is then deposited over device layer 124.

Figure 8B:
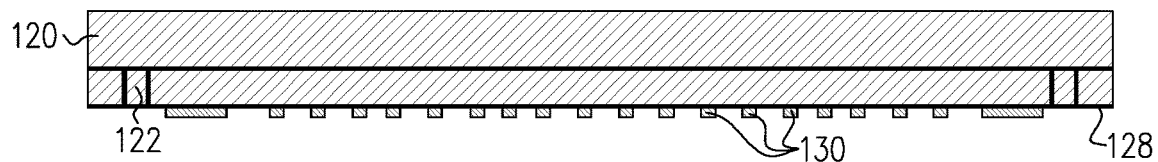
Figure 8C:
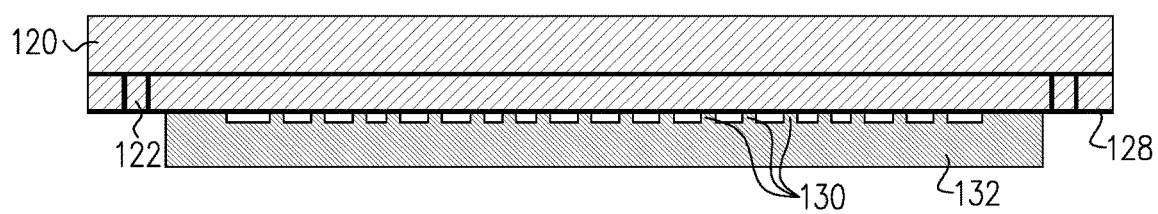
Figure 8D:
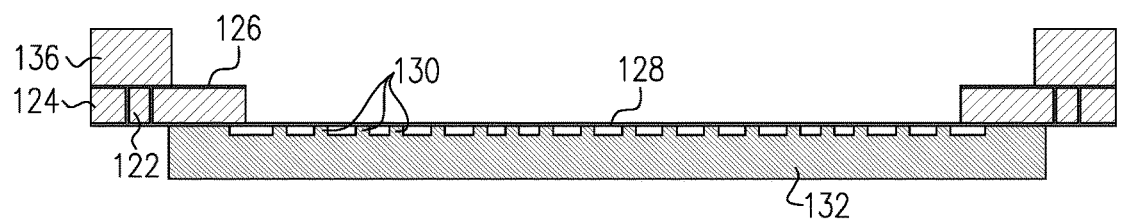
Figure 8E:
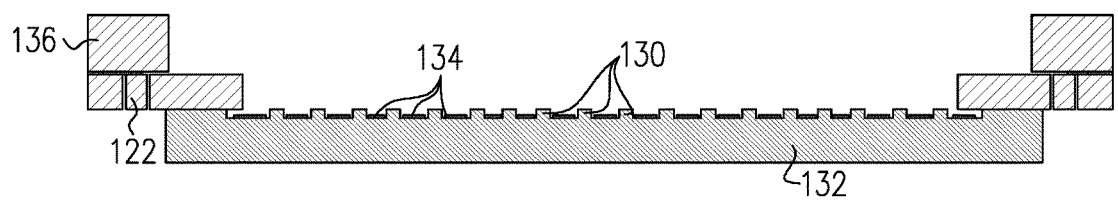

To create the first diffractive structure, sub-wavelength elements 130 are formed over oxide layer 128, as shown in FIG. 8B. Elements 130 can be formed by lithographic etching or by a nano-imprint process, for example, and may comprise a dielectric material, such as $SiO_2$, or a semiconductor material, such as silicon. Optionally, the area between elements 130 can be filled with another material (inorganic or organic) in order to create a planar surface, which will be easier to bond. A transparent substrate 132, such as a glass blank, is bonded to the outer side of elements 130, as shown in FIG. 8C. Substrate 132 may be bonded to elements 130 by oxide bonding, for example, or by polymer bonding, To expose the diffractive structure formed by elements 130, substrate 120 and device layer 124 are etched and/or ground away, as shown in FIG. 8D. The remaining margins of substrate 120 will serve as a frame 136 for the device. Oxide layer 128 is then etched away to expose elements 130 of the diffractive structure and to release beams 122, which flexibly connect substrate 132 to frame 136. One or more electrodes 134 are deposited on substrate 132, for example interleaved with elements 130 as in the embodiment of FIGS. 7A/B. Alternatively, the electrodes may be deposited on substrate 120 before formation of elements 130.

Figure 8F:
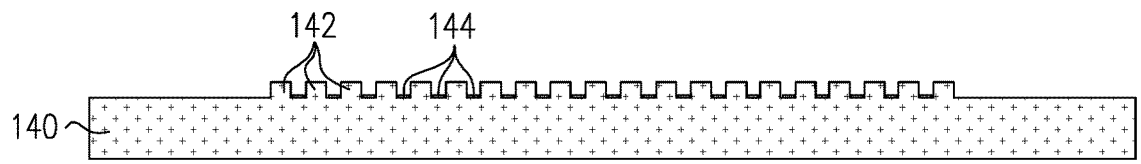
Figure 8G:
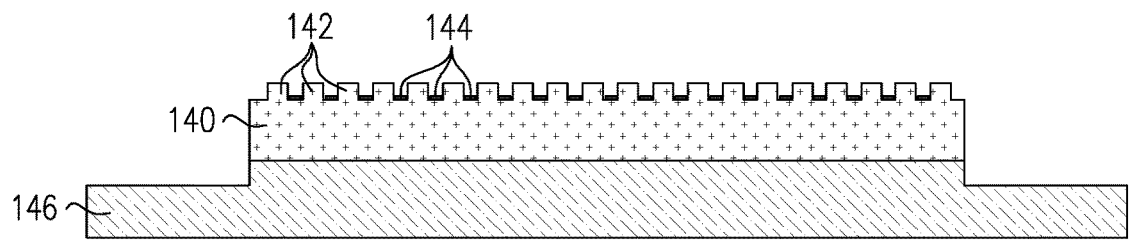

To create the second diffractive structures, sub-wavelength elements 142 are formed on a transparent substrate 140, such as a glass wafer, as shown in FIG. 8F. Elements 142 are formed, for example, by lithographic or nano-imprint methods, as noted above. One or more electrodes 144 are deposited on substrate 140, either prior to or after the formation of elements 142. Substrate 140 is sawed to create an individual transparent chip, which is bonded to a supporting substrate 146, as shown in FIG. 8G. In the pictured embodiment, substrate 146 comprises a material that is transparent to light at the design wavelength of device 150. Alternatively, substrate 146 may comprise silicon, which is subsequently etched or ground away in its central area to expose substrate 140.

Figure 8H:
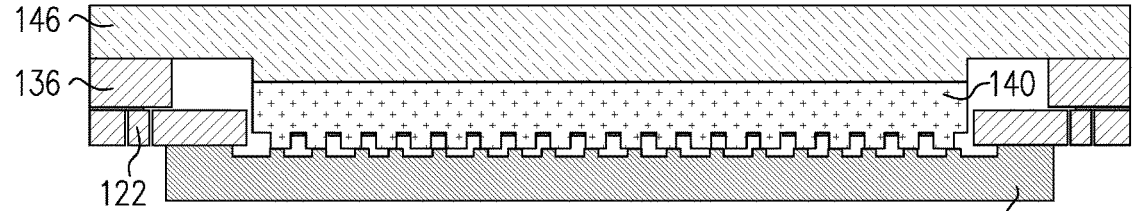
Figure 8I:
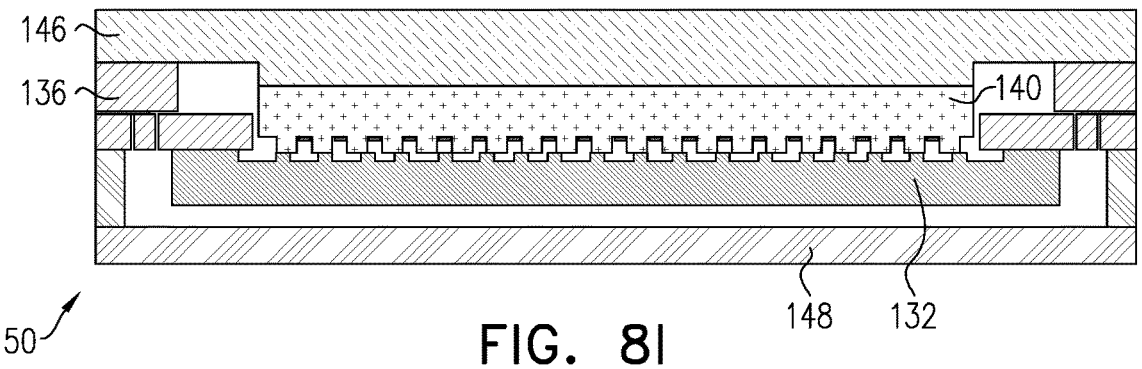

To complete device 150, substrate 146 is bonded to frame 136, as shown in FIG. 8H. The diffractive structures on substrates 132 and 140 are now in mutual proximity, while substrate 132 is able to move transversely on beams 122. A protective transparent cover 148 is fitted over substrate 132 and bonded to frame 136, as shown in FIG. 8I. Electrodes 134 and 144 are connected electrically to a control circuit, and device 150 is mounted in the appropriate location in an optical system, as shown in FIGS. 1A/B, for example.

FIGS. 9A-9G are schematic sectional views showing successive stages in a method for fabrication of an optical beam modulation device 180, in accordance with an alternative embodiment of the invention. Some of the components in this process, as well as the methods used in fabricating these components, are similar or identical to components used in the process of FIGS. 8A-8I. These components are marked in FIGS. 9A-9G with the same indicator numbers as in FIGS. 8A-8I. The planar electrodes are omitted from this embodiment for the sake of simplicity.

Figure 9A:
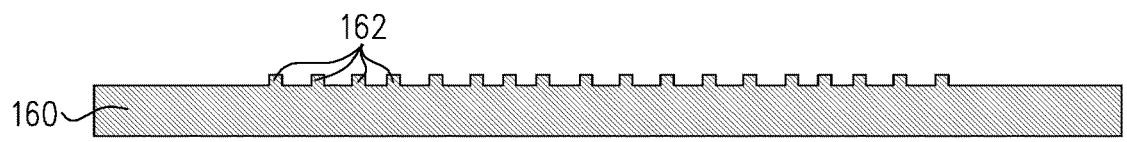
FIGS. 9A, 9B, 9C, 9D, 9E, 9F and 9G are schematic sectional views showing successive stages in a method for fabrication of an optical beam modulation device, in accordance with an alternative embodiment of the invention.
Figure 9B:
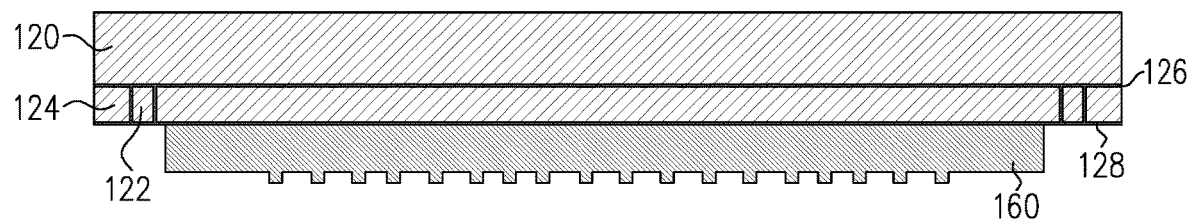
Figure 9C:
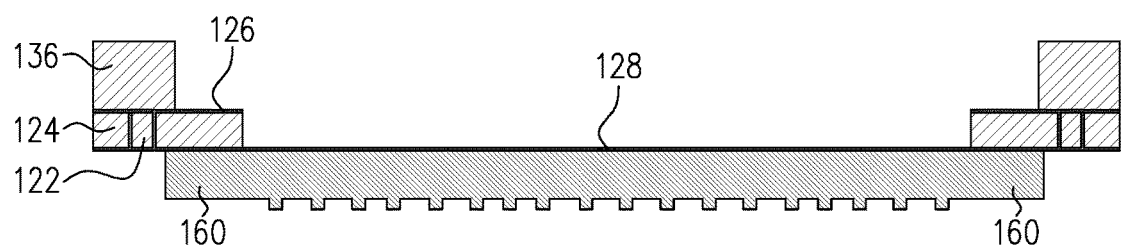
Figure 9D:
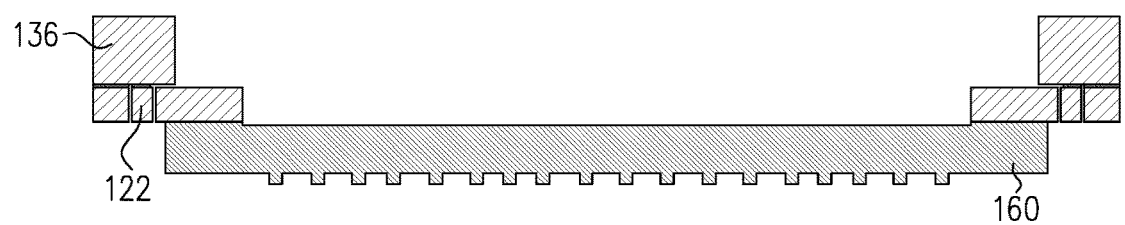

In the present embodiment, sub-wavelength elements 162 are formed on a transparent substrate 160, such as a glass wafer, as shown in FIG. 9A, for example by lithographic or nano-imprint methods. Substrate 160 is bonded to oxide layer 128 on SOI substrate 120, into which beams 122 have been etched, as shown in FIG. 9B. Substrate 120 and device layer 124 are etched and/or ground to expose oxide layer 128 and to create frame 136, as shown in FIG. 9C. The oxide layer is then etched away to free beams 122, as shown in FIG. 9D.

Figure 9E:
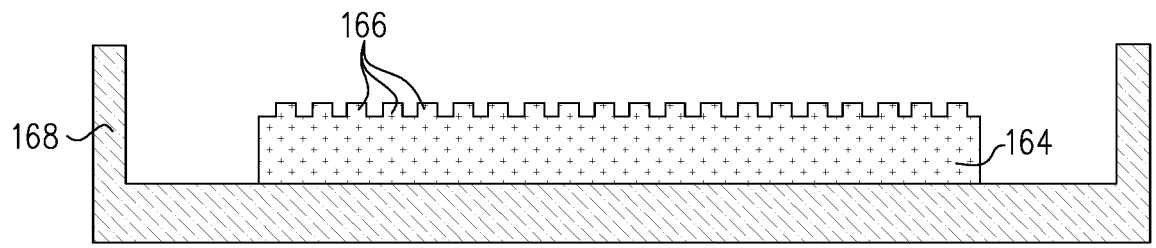
Figure 9F:
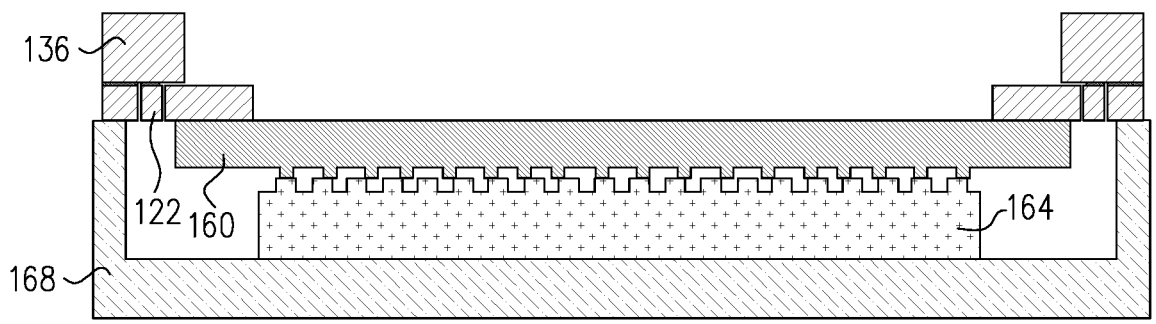
Figure 9G:
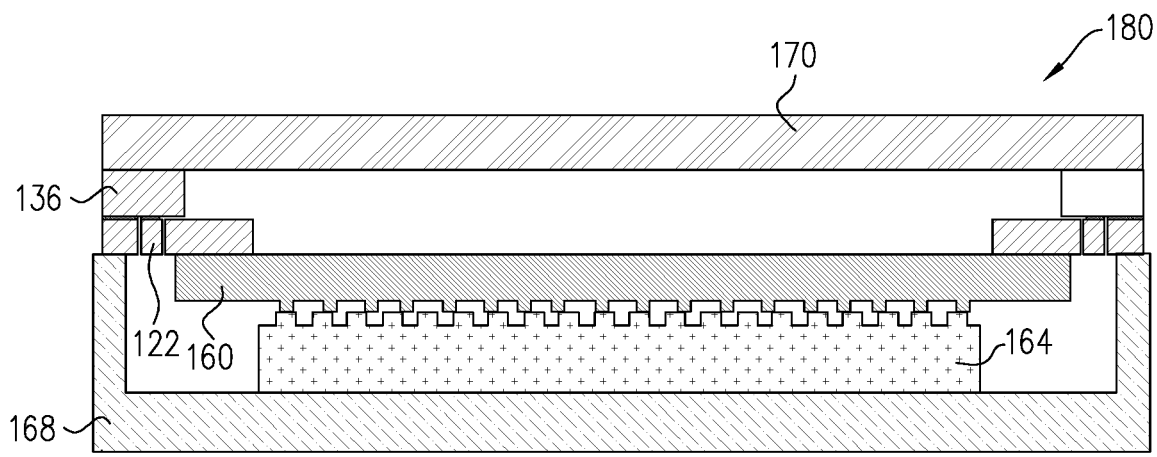

To create the second diffractive structures, sub-wavelength elements 166 are formed on a transparent substrate 164, such as a glass wafer, as shown in FIG. 9E. Substrate 164 is bonded to the base of a transparent case 168. Case 168 is bonded to frame 136, as shown in FIG. 9F. The diffractive structures on substrates 160 and 164 are now in mutual proximity, while substrate 160 is able to move transversely on beams 122. A protective transparent cover 170 is fitted over substrate 160 and bonded to frame 136, as shown in FIG. 9G. The electrodes are connected, and device 180 is mounted in the appropriate location in an optical system.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optical device, comprising:
a first planar substrate having a first face and comprising a first diffractive structure disposed on the first face;
a second planar substrate having a second face and comprising a second diffractive structure disposed on the second face;
a first planar electrode disposed on the first face;
a second planar electrode disposed on the second face;
a mount holding the second planar substrate parallel to the first planar substrate, with the second face adjacent to the first face and with the first and second planar electrodes in mutual proximity, while permitting the second planar substrate to move transversely relative to the first planar substrate; and
a control circuit, which is coupled to apply an electrical potential between the first and second planar electrodes with a voltage sufficient to shift the second diffractive structure transversely relative to the first diffractive structure.

2. The device according to claim 1, wherein the mount comprises a set of flexible beams connecting the second planar substrate to a frame to which the first planar substrate is fixed.

3. The device according to claim 2, wherein the flexible beams comprise silicon.

4. The device according to claim 1, and comprising third and fourth planar electrodes disposed in mutual proximity on the first and second faces, respectively,
wherein the control circuit is configured to apply a first electrical potential between the first and second planar electrodes in order to shift the second diffractive structure relative to the first diffractive structure in a first transverse direction and to apply a second electrical potential between the third and fourth planar electrodes in order to shift the second diffractive structure relative to the first diffractive structure in a second transverse direction, different from the first transverse direction.

5. The device according to claim 1, wherein the first and second planar electrodes are interleaved respectively in the first and second diffractive structures.

6. The device according to claim 5, wherein the first and second planar electrodes are disposed in respective serpentine patterns within the first and second diffractive structures.

7. The device according to claim 1, wherein the second planar substrate has a third face opposite the second face, and wherein the device comprises;
a planar cover, which has a fourth face and is mounted with the fourth face parallel to and in proximity to the third face; and
third and fourth planar electrodes disposed in mutual proximity on the third and fourth faces, respectively, and
wherein the control circuit is configured to apply simultaneously a first electrical potential between the first and second planar electrodes and a second electrical potential between the third and fourth planar electrodes in order to shift the second diffractive structure relative to the first diffractive structure.

8. The device according to claim 1, and comprising an actuator, which is controllable by the control circuit to apply a first transverse shift to the second diffractive structure relative to the first diffractive structure, wherein application of the electrical potential between the first and second planar electrodes applies a second transverse shift to the second diffractive structure in addition to the first transverse shift.

9. The device according to claim 1, and comprising a spacer, which is disposed between the first and second faces and is configured to maintain a predefined distance between the first and second faces while permitting the second planar substrate to move transversely relative to the first planar substrate.

10. The device according to claim 9, wherein the spacer comprises a liquid enclosed between the first and second faces.

11. The device according to claim 9, wherein the spacer comprises one or more spherical particles, which roll between the first and second faces as the second planar substrate moves transversely relative to the first planar substrate.

12. An optical system, comprising:
the device according to claim 1; and
a radiation source, which is configured to direct a beam of optical radiation toward the device,
wherein shifting the second diffractive structure transversely relative to the first diffractive structure modifies an optical property of the beam.

13. The system according to claim 12, wherein the first and second planar substrates are transparent to the optical radiation, and the device is configured to modify the optical property as the beam is transmitted through the device.

14. The system according to claim 12, wherein the device is configured to modify the optical property as the beam is reflected from the device.

15. A method for controlling a beam of optical radiation, the method comprising:
directing the beam of optical radiation toward a device comprising:
a first planar substrate having a first face and comprising a first diffractive structure disposed on the first face;
a second planar substrate having a second face and comprising a second diffractive structure disposed on the second face;
a first planar electrode disposed on the first face;
a second planar electrode disposed on the second face; and
a mount holding the second planar substrate parallel to the first planar substrate, with the second face adjacent to the first face and with the first and second planar electrodes in mutual proximity, while permitting the second planar substrate to move transversely relative to the first planar substrate; and
applying an electrical potential between the first and second planar electrodes with a voltage sufficient to shift the second diffractive structure transversely relative to the first diffractive structure, thereby modifying an optical property of the beam.

16. The method according to claim 15, wherein the first and second planar substrates are transparent to the optical radiation, and wherein modifying the optical property comprises modifying the beam as the beam is transmitted through the device.

17. A method for fabricating an optical device, comprising:
forming a first diffractive structure on a first face of a first planar substrate;
forming a second diffractive structure on a second face of a second planar substrate;
depositing a first planar electrode on the first face;
depositing a second planar electrode on the second face;
mounting the second planar substrate parallel to the first planar substrate, with the second face adjacent to the first face and with the first and second planar electrodes in mutual proximity, while permitting the second planar substrate to move transversely relative to the first planar substrate; and
coupling a control circuit to apply an electrical potential so as to shift the second diffractive structure transversely relative to the first diffractive structure.

18. The method according to claim 17, wherein forming the first diffractive structure and the second diffractive structure comprises applying at least one of an etching process and a nano-imprint process to the first face and the second face to create diffractive elements.

19. The method according to claim 17, wherein depositing the first planar electrode and the second planar electrode comprises interleaving at least one of the first and second planar electrodes with at least one of the first and second diffractive structures.

20. The method according to claim 17, wherein depositing the first planar electrode and the second planar electrode comprises depositing at least one of the first and second planar electrodes on at least one of the first face and the second face before forming the diffractive structure on the at least one of the first face and the second face.

* * * * *